United States Patent [19]
Nishimura

[11] Patent Number: 5,867,035
[45] Date of Patent: Feb. 2, 1999

[54] VOLTAGE TO CURRENT CONVERSION CIRCUIT FOR CONVERTING VOLTAGE TO MULTIPLE CURRENT OUTPUTS

[75] Inventor: Kouichi Nishimura, Tokyo, Japan

[73] Assignee: NEC Corporation, Tokyo, Japan

[21] Appl. No.: 886,249

[22] Filed: Jul. 1, 1997

[30] Foreign Application Priority Data

Jul. 3, 1996 [JP] Japan ..................... 8-173315

[51] Int. Cl.$^6$ ....................... G05F 3/16
[52] U.S. Cl. .................. 325/315; 325/316
[58] Field of Search ................. 323/312, 315, 323/316; 330/257, 258; 327/542, 543

[56] References Cited

U.S. PATENT DOCUMENTS

| | | | |
|---|---|---|---|
| 4,467,289 | 8/1984 | Okada | 323/315 X |
| 5,087,891 | 2/1992 | Cytera | 323/315 X |
| 5,157,322 | 10/1992 | Llewellyn | 323/315 |

FOREIGN PATENT DOCUMENTS 61-45314   3/1986   Japan .

Primary Examiner—Peter S. Wong
Assistant Examiner—Y. J. Han
Attorney, Agent, or Firm—Whitham, Curtis & Whitham

[57] ABSTRACT

This invention provides an absolute value voltage to current conversion circuit which realizes multiple outputs of the current obtained by the conversion of a voltage. For an input voltage of positive polarity, an inverting voltage to current conversion circuit is formed by means of an operational amplifier and a multiple output current mirror circuit. In that case, currents which are 1/n of a converted current are obtained by setting the ratio of the input current to the output current of the current mirror circuit to n:1. For an input voltage of negative polarity, a noninverting voltage to current conversion circuit is formed by means of the operational amplifier and a plurality, n, of bipolar transistors. The converted current is distributed among n bipolar transistors to obtain an output current per transistor which is 1/n of the converted current. As a result, an absolute value voltage to current conversion circuit with multiple outputs can be realized.

10 Claims, 3 Drawing Sheets

VOLTAGE TO CURRENT CONVERSION CIRCUIT FOR CONVERTING VOLTAGE TO MULTIPLE CURRENT OUTPUTS

BACKGROUND OF THE INVENTION

1. Field of the Invention

The present invention relates to a voltage to current conversion circuit which, and more particularly a voltage to current conversion circuit for converting an input voltage to a multiple current outputs.

2. Description of the Prior Art

A circuit which converts an input voltage to a current, obtaining at the same time the absolute value of the voltage, is disclosed in Japanese Patent Application Laid-Open No. Sho 61-45314. FIG. 4 shows the circuit diagram of the absolute value voltage to current conversion circuit. In this absolute value voltage to current conversion circuit, one end of a resistor R6 is connected to an input voltage terminal Vin, and the other end of the resistor is connected in common to the inverting input of an operational amplifier A3, the base and the collector of an NPN transistor Q1, the base of an NPN transistor Q2, and the emitter of an NPN transistor Q3. The noninverting input of A3 is connected to a reference voltage terminal (the ground in this case). The output of A3 is connected in common to the emitter of Q1, the emitter of Q2, and the base of Q3. This conversion circuit is completed by connecting the collectors of Q2 and Q3 in common and serving it as an output terminal Io.

In this example, when the polarity of the input voltage Vin is positive, the transistors Q1 and Q2 go to active state and the transistor Q3 goes to cut-off state. This is because Q1 is in the active state so that the emitter and base junction of Q3 is in the reverse bias state. Since A3 is being subjected to a negative feedback through Q1, the inverting input of A3 goes to virtually grounded state so that a current given by Vin/R6 flows in Q1, on the assumption that the common emitter current amplification factor (hFE) of the transistor has such a large value that its effect can safely be neglected. Besides, the transistors Q1 and Q2 constitute a current mirror circuit, so that a current with the same value as that of the collector current of Q1 flows in the collector of Q2, which serves as the output current Iout. On the contrary, when the polarity of the input voltage Vin is negative, Q3 goes to the active state and Q1 and Q2 go to the cut-off state. Since A3 is subjected to a negative feedback via the base-emitter junction of Q3, the inverting input of A3 goes again to the virtually grounded state. Consequently, an output current Iout given by Vin/R6, the same expression as in the case of positive polarity of the input voltage Vin, is output from the output terminal Io via the collector of Q3.

To summarize the above, the relation between the input voltage Vin and the output current Iout is given by Eq. (1) below.

$$Iout \approx |Vin|/R6. \quad (1)$$

In other words, the absolute value of an input voltage Vin is converted to a current by a resistance R6, and the relationship between the input voltage Vin and the output current Iout is as shown in FIG. 5. Here, it should be reminded that the result in Eq. (1) above is an approximation to the rigorous expressions given below.

$$Iout=(Vin+/R6)[hFE/(1+hFE)](\text{for } Vin>0), \quad (2)$$

$$Iout=(-Vin-/R6)[hFE/(1+hFE)](\text{for } Vin<0). \quad (3)$$

In the above, R6 is the resistance of the resistor R6, and hFE is the common emitter current amplification factor of the transistors Q1 to Q3.

In an NPN transistor formed as an integrated circuit, hFE generally has a value of more than 100 even for a small current on the order of several mA, although it depends on the emitter size. Accordingly, the conversion error due to hFE is less than 1% for both cases of positive and negative polarity of Vin, as can be seen from Eqs. (2) and (3), and the symmetry with respect to the polarity of the input voltage is excellent, justifying the validity of Eq. (1).

However, with the circuit in the above it is not possible to realize multiple output of the current. That is, owing to the nature of the current, if the current is taken once at a point as an output, then it is no longer possible to use it as another output at somewhere else. In contrast, in the case of the voltage, it is possible to take it out at a plurality of points as outputs so long as the output current capacity permits to do so.

SUMMARY OF THE INVENTION

It is an object of the present invention to provide a voltage to current conversion circuit which converts the absolute value of an input voltage to a current and enables to obtain a plurality of current outputs.

It is another object of this invention to provide a voltage to current conversion circuit which generates a plurality of currents with a simple configuration of the circuit.

The absolute value voltage to current conversion circuit according to one mode of this invention includes a resistor with its one end connected to an input voltage terminal (or reference voltage terminal), an operational amplifier with its inverting input connected to the other end of the resistor and the input terminal of a multiple output current mirror circuit, its noninverting input connected to the reference voltage terminal (or the input voltage terminal), and its output connected to a common terminal of the multiple output current mirror circuit, and a plurality, n, of bipolar transistors with their respective gates connected in common to the output of the operational amplifier, and their respective emitters connected in common to the inverting input of the operational amplifier.

The absolute value voltage to current conversion circuit according to another mode of this invention includes a second and a fourth resistors with every one end of them connected to corresponding differential input voltage terminal, a third and a fifth resistors with every one end of them connected to the other end of each of the second and fourth resistor, and the other end of them connected in common to a reference voltage terminal, an operational amplifier with its inverting input connected to the junction of the second and the third resistors, and the input terminal of a multiple output current mirror circuit having the input current to output current ratio of n:1, its noninverting input connected to the junction of the fourth and the fifth resistors, and its output connected to the common terminal of the multiple output current mirror circuit, and a plurality, n, of bipolar transistors with their respective bases connected in common to the output of the operational amplifier.

When the polarity of the input voltage is positive, a current mirror circuit CM goes to the active state and NPN transistors Q1 to Qn go to the cut-off state. The input voltage is converted to a current by means of a resistor R1 and the current is served as the input current to the current mirror circuit CM. This current is inverted by the current mirror circuit to flow in the suction current direction, and at the same time the current value is reduced to 1/n of that of the input current. On the other hand, when the polarity of the input voltage is negative, the NPN transistors Q1 to Qn go to the active state and the current mirror circuit CM goes to the cut-off state. The input voltage is converted to a current by means of the resistor R1, and currents in the suction direction are output from the collectors of the transistors Q1 to Qn. Since the converted current is distributed among the transistors Q1 to Qn, the current in each of the transistors Q1 to Qn is equal to 1/n of the converted current. As is clear from the above, for both cases of positive and negative polarities of the input voltage, the direction of the current in Q1 to Qn is the same as that of the suction current, showing eventually that the absolute value of the input voltage is obtained.

BRIEF DESCRIPTION OF THE DRAWINGS

The above and other objects, features, and advantages of the present invention will be more apparent from the following description taken in conjunction with the accompanying drawings, in which.

DESCRIPTION OF THE PREFERRED EMBODIMENTS

Figure 1:
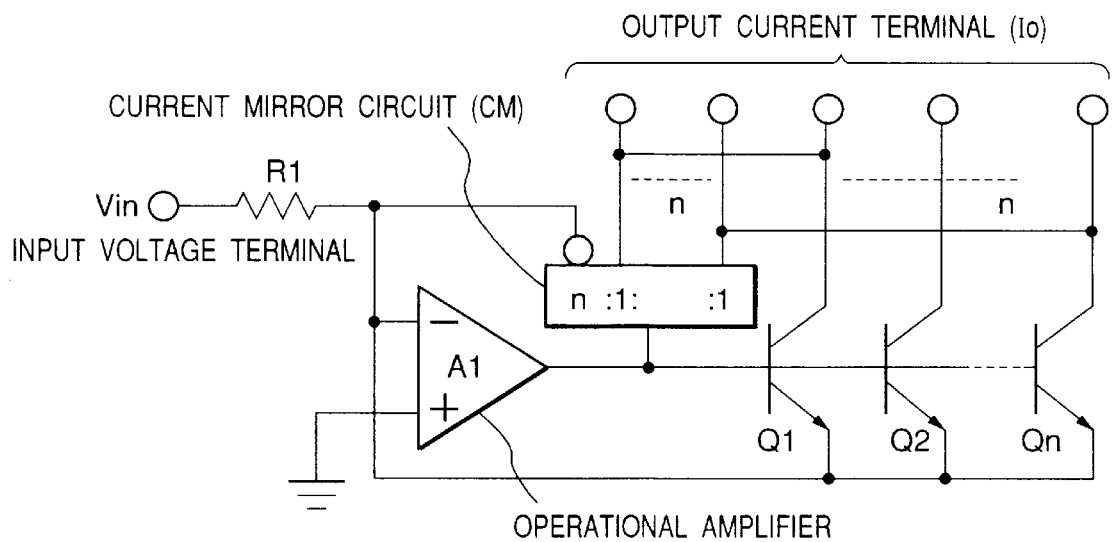
FIG. 1 is a circuit diagram showing the configuration of the absolute value voltage to current conversion circuit according to an embodiment of this invention.

Next, referring to the drawings, the embodiments of this invention will be described in detail.

FIG. 1 is a circuit diagram showing the configuration of the absolute value voltage to current conversion circuit according to a first embodiment of this invention. This circuit comprises a resistor R1 with its one end connected to an input voltage terminal, an operational amplifier A1 with its inverting input connected to the other end of the resistor R1 and an input terminal of a current mirror circuit CM having n outputs, its noninverting input grounded, and its output connected to the common terminal of the current mirror circuit CM, and n units of NPN bipolar transistors Q1 to Qn with their respective bases connected in common to the output of the operational amplifier A1, and their respective emitters connected in common to the inverting input of the operational amplifier A1. Here, the ratio of the input current to the output current is set to be n:1. The output terminals of this conversion circuit are composed of the n output terminals of the current mirror circuit CM and the n collectors of the transistors Q1 to Qn.

Next, the operation of this circuit will be described. First, the case in which a voltage with positive polarity is input to an input voltage terminal Vin will be considered. In this case, the operational amplifier A1 is subjected to a negative feedback via the input terminal and the common terminal of the current mirror circuit CM. Because of this, the inverting input terminal of the operational amplifier A1 goes to the relation of imaginary short-circuiting with the noninverting input terminal, so that the potential of the inverting input terminal becomes equal to the ground potential of the noninverting input terminal. Accordingly, the current I1 flowing in the resistor R1 is given by $$I1 = Vin/R1. \qquad (4)$$

Since the current flowing to the input terminal of the operational amplifier A1 is on the order of nA and is almost negligible, practically the entirety of the current I1 flowing in the resistor R1 serves as the input current to the current mirror circuit CM. The ratio of the input current to the output current of the current mirror circuit CM is 1:1/n as mentioned above, and their polarities are in the inverse relation with each other, so that the output current I0 is given by $$I0 = -I1/n = -Vin/(nR1). \qquad (5)$$

In this case, the potential difference between the input terminal and the output terminal of the current mirror circuit CM is, though it varies with the circuit form, more than 0.7V at the least. Consequently, the voltage between the emitter and the base of each of the transistors Q1 to Qn is in the reverse bias of more than 0.7V, and the transistors Q1 to Qn go to the cut-off state. Therefore, the collector currents go to zero.

Next, the case in which a voltage with negative polarity (-Vin) is input to the input voltage terminal will be considered. In this case, the operational amplifier A1 is subjected to a negative feedback via transistors Q1 to Qn having their bases and emitters respectively connected in common. Then, the inverting input terminal of the operational amplifier A1 goes to the relation of imaginary short-circuiting with the noninverting input terminal as before, and the potential of the inverting input terminal goes to that of the noninverting input terminal which is the ground potential. Accordingly, the current I1 that flows in the resistor R1 is the same as that given by Eq. (4) above. Since the current that flows into the input terminal of the operational amplifier A1 is on the order of nA and is almost negligible, the entirety of the current I1 flowing in the resistor R1 is used as the emitter currents of the transistors Q1 to Qn. If it is assumed that the characteristics of respective transistors Q1 to Qn are satisfactorily matched, the current I1 is uniformly distributed among the transistors to give an emitter current IE to respective ones of the transistors Q1 to Qn, so that $$IE = I1/n. \qquad (6)$$

If it is assumed that the common emitter current amplification factor hFE has a sufficiently large value such that its effect can safely be neglected, then the output current I0 from the collector of the transistor can be expressed by $$I0 = IE = I1/n = -Vin/(nR1), \qquad (7)$$

which is the same as Eq. (5). In other words, the polarity of the output current is the same for both polarities of the input voltage, so that it can eventually be said that the absolute value of the input voltage is converted to the current provided that the number of the outputs of the current mirror circuit CM equal to the number n of the transistors Q1 to Qn.

It should be noted here that the validity of the description above is contingent upon the conformity of characteristics of the various transistors Q1 to Qn. When the above circuit is actually integrated, the conformity of characteristics among a plurality of transistors on the same chip is effectively realized.

As described above, it is possible to augment the number of current outputs by adding the number of outputs of the current mirror circuit and the number of transistors Q1 to Qn for conversion of the voltage to the current.

Figure 2:
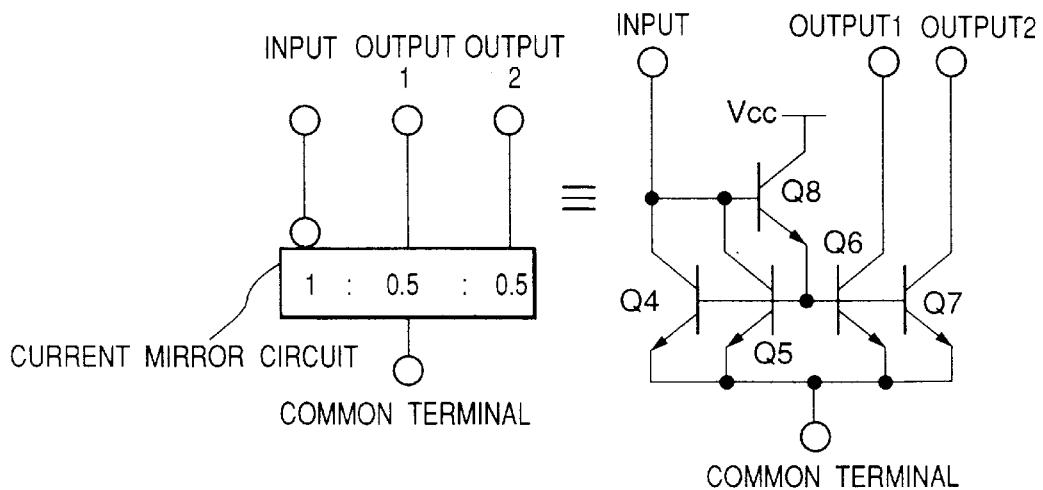
FIG. 2 is a circuit diagram showing the configuration of the current mirror circuit in FIG. 1.

FIG. 2 shows an embodiment of the current mirror circuit CM for the case of two outputs (n=2), where the ratio of the input current to the output current of the current mirror circuit is 1:0.5:0.5. Referring to FIG. 2, this current mirror circuit comprises NPN transistors Q4 to Q7 with their bases and emitters connected in common separately, and an NPN transistor Q8 with its base connected in common to the collectors of the transistor Q4 and Q5, its emitter connected in common to the bases of the transistors Q4 to Q7, and its collector connected to a positive power supply Vcc. The common junction of the collectors of the transistors Q4 and Q5, and the base of the transistor Q8 serves as the current input terminal, and respective collectors of the transistors Q6 and Q7 serve as a first and a second outputs, respectively. The transistor Q8 is for supplying the base current for the transistors Q4 to Q7, and also for reducing errors due to the common emitter current amplification factor hFE. The relation between the output current I0 and the input current Iin of the current mirror circuit for this case is given specifically by the following.

$$I0 = Iin \left( \frac{1}{2 + \frac{4}{hFE(hFE+1)}} \right). \quad (8)$$

If the general value of 200 is assumed for the common emitter current amplification factor hFE, Eq. (8) becomes $$I0 = 0.499975 \ Iin, \quad (9)$$

which has an error of only 0.005% against the target value $$I0 = 0.5 \ Iin. \quad (10)$$

Accordingly, it may be considered that Eq. (10) is substantially realized.

In obtaining the above result, it is assumed that the characteristics of the transistors Q4 to Q7 are satisfactorily consistent with each other. When the circuit is integrated, the matching of the characteristics of a plurality of transistors on the same chip are actually realized as mentioned above.

In FIG. 2, a special case of n=2 is described. To realize the general case of an arbitrary value of n, it is only necessary to provide an input of the current mirror circuit, prepare n units of transistors (Q4 and Q5 in the example in FIG. 2) where collectors, bases, and emitters of respective transistors are separately connected in common, and prepare n units of transistors (Q6 and Q7 in the example in FIG. 2) whose bases and emitters are separately connected in common.

Figure 3:
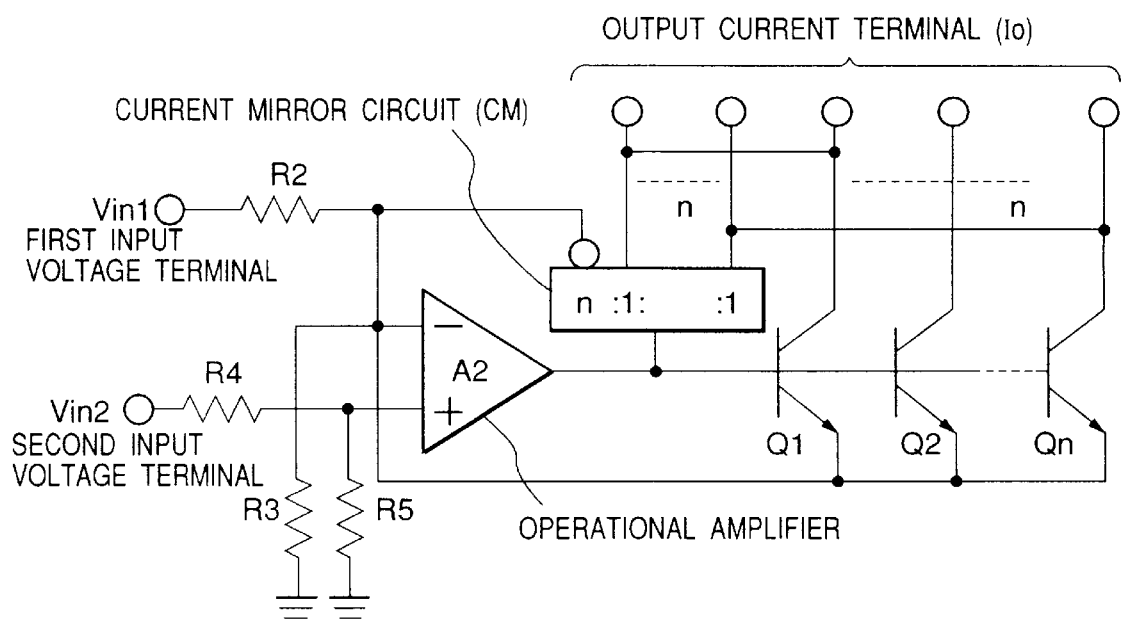
FIG. 3 is a circuit diagram showing the configuration of the absolute value voltage to current conversion circuit according to another embodiment of this invention.
Figure 4:
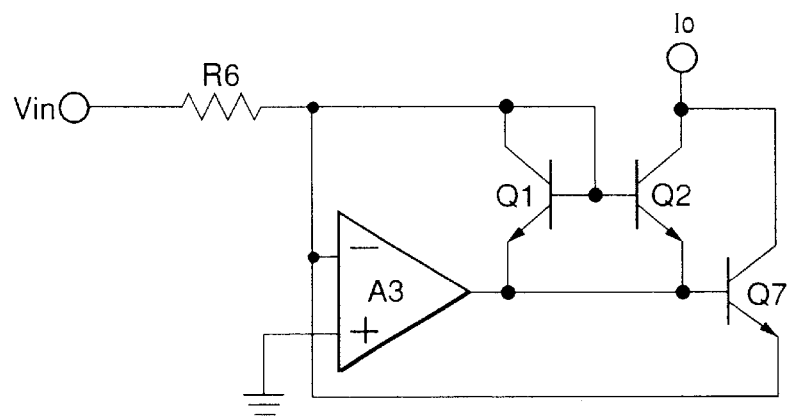
FIG. 4 is a circuit diagram showing the configuration of the absolute value voltage to current conversion circuit of the prior art.
Figure 5:
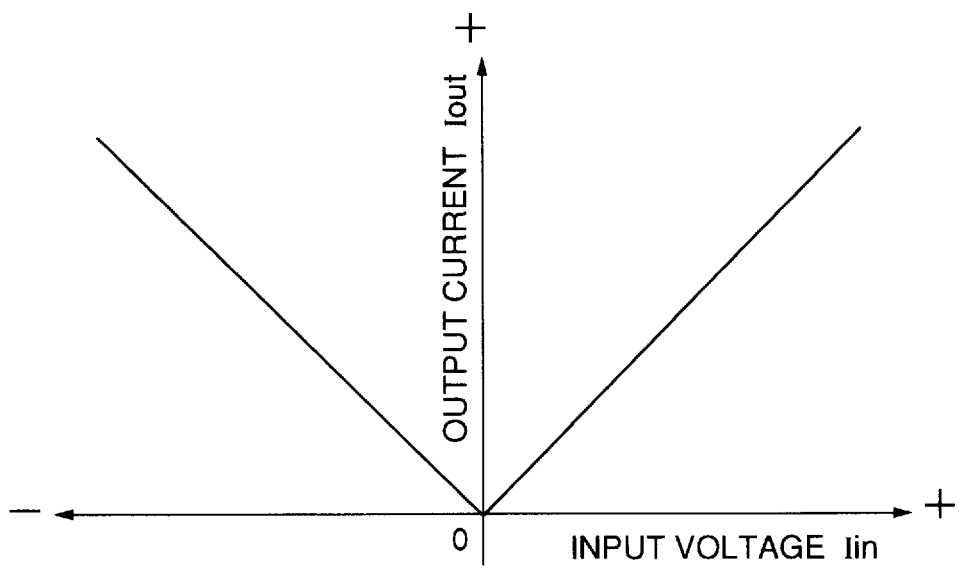
FIG. 5 is a graph showing the input/output characteristic of the circuit in FIG. 4.

Next, referring to FIG. 3, a second embodiment of this invention will be described. In the figure, components identical to those in FIG. 1 are assigned identical symbols to omit further description. Referring to FIG. 3, this embodiment comprises a resistor R2 with its one end connected to a first voltage input terminal, a resistor R4 with its one end connected to a second input voltage terminal, resistors R3 and R5 with one end of each connected to the other end of each of the resistors R2 and R4, and each of the other end connected to the ground potential, an operational amplifier A2 with its inverting input connected to the junction of the resistors R2 and R3 and the input terminal of a multiple output current mirror circuit CM, its noninverting input connected to the junction of the resistors R4 and R5, and its output connected to the common terminal of the current mirror circuit CM, and a plurality, n, of NPN transistors with their bases connected in common to the output of the operational amplifier A2. In addition, the ratio of the input and output currents of the current mirror circuit CM is set to be n:1.

The operation of this circuit will be described in detail next. First, the voltage V+ of the noninverting input of the operational amplifier A2 is the divided voltage of an input voltage by the resistors R3 and R5. Hence, V+ is given by $$V+ = Vin2 R5/(R4+R5), \quad (11)$$

where Vin2 is the voltage input to the second input voltage terminal.

Since the voltage V− of the inverting input of the operational amplifier A2 goes to the relation of imaginary short-circuiting with the potential of the noninverting input terminal, the potentials of both terminals become equal, namely, $$V- = V+. \quad (12)$$

If the current flowing into the input terminal of the current mirror circuit CM or the current flowing in the transistors Q1 to Qn is called Iin, it is given by the value obtained by subtracting the current I3 flowing in the resistor R3 from the current I2 flowing in the resistor R2. Consequently, the following relation holds.

$$\begin{aligned} Iin &= I2 - I3 \\ &= \{Vin - Vin R5/(R4+R5)\}/R2 - \\ &\quad \{Vin R5/R3(R4+R5)\}. \end{aligned} \quad (13)$$

By reexpressing Eq. (13) in terms of Vin1 (voltage input to the first input terminal) and Vin2, there is obtained $$Iin = \frac{1}{R2} \left\{ Vin1 - Vin2 \left( \frac{R5}{R4+R5} + \frac{R5}{R4+R5} \cdot \frac{R2}{R3} \right) \right\}. \quad (14)$$

If the resistances are so set as to satisfy R4/R5=R2/R3 and R2=R, the output current of the current mirror circuit and the collector current of the transistors Q1 to Qn, Iout, is given by $$Iout = (Vin1 - Vin2)/nR \quad (15)$$

Since the principle by which the absolute value of the output current is obtained from the input voltage is the same as in the first embodiment, further description will be omitted.

In this manner, for the example in FIG. 3, conversion of the differential voltage to an absolute value of current can be accomplished.

As in the above, according to this invention, the conversion coefficient can be made the same for both cases of positive and negative input voltages by setting the ratio of the input current to the output current to be proportional to the number of outputs, and as a result, it is possible to obtain multiple current outputs in a circuit for converting an input voltage to an absolute current value.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A voltage to current conversion circuit comprising: a resistor with its one end connected to either one of an input voltage terminal or a reference voltage terminal, an operational amplifier with its inverting input connected to the other end of said resistor and an input terminal of a multiple output current mirror circuit, its noninverting input connected to the other of said input voltage terminal and said reference voltage terminal, and its output connected to a common terminal of said multiple output current mirror circuit, and a plurality, n, of bipolar transistors with their respective bases connected in common to the output of said operational amplifier and their respective emitters connected in common to the inverting input of said operational amplifier, wherein the ratio of the input to the output currents of said multiple output current mirror circuit is set to be n:1, and the outputs of said multiple output current mirror circuit and the collectors of said plurality, n, of the bipolar transistors are served as the output terminals.

2. A voltage to current conversion circuit comprising, a first and a second resistors with each one end of them connected to each of a first and a second input voltage terminals, a third and a fourth resistors with each one end of them connected to each of the other end of said first and second resistors and the other end of each of them connected in common to a reference voltage terminal, an operational amplifier with its inverting input connected to the junction of said first resistor and said third resistor and an input terminal of a multiple output current mirror circuit, its noninverting input connected to the junction of said second resistor and said fourth resistor, and its output connected to the common terminal of said multiple output current mirror circuit, and a plurality of n pieces of bipolar transistors with their respective bases connected in common to the output of said operational amplifier, wherein the ratio of the input current to the output current of said multiple output current mirror circuit is set to be n:1, and the outputs of said multiple output current mirror circuit and the collectors of said plurality, n, of bipolar transistors are served as the output terminals.

3. A circuit comprising:

an input terminal receiving an input voltage;

a current mirror circuit connected to a first common nodes and having an input node and first and second output node, and said current mirror circuit outputting a first output current to said first output node in response to an input current flowing to said input node when said input current is a first polarity and outputting a second output current to said second output node in response to said input current when said input current is said first polarity;

a first transistor connected between said first output node and said input node and a control node of said first transistor connected to said first common node, and said first transistor outputting a third output current flowing opposite direction to said first output current having a same magnitude of said first output current; and a second transistor connected between said second output node and said input node and a control node of said second transistor connected to said first common node, and said second transistor outputting a fourth current and a same magnitude of said second output current.

4. The circuit as claimed in claim 3, further comprising an amplifier having a first polarity input node connected to said first terminal, a second polarity input node connected to a second input terminal, and a third output node connected to said first common node.

5. The circuit as claimed in claim 3, wherein a rate between said input current and said first current is same as a rate between said input current and said third current, and a rate between said input current and said second current is same as a rate between said input current and said fourth current.

6. The circuit as claimed in claim 3, wherein said current mirror circuit has a third transistor connected between said input node and said first common node and a control node of said third transistor connected to a second common node, a fourth transistor connected between said first output node and said first common node and a control node of said fourth transistor connected to said second common node, and a fifth transistor connected between said second output node and said first common node and a control node of said fifth transistor connected to said second common node.

7. The circuit as claimed in claim 6, wherein said current mirror circuit has sixth transistor connected between said input node and said first common node.

8. The circuit as claimed in claim 7, wherein said third, fourth, fifth, and sixth transistor having same current supplying ability.

9. The circuit as claimed in claim 8, wherein said current mirror circuit has a seventh transistor connected between a first power supply line and said second common node and a control node of said seventh transistor connected to said input node.

10. The circuit as claimed in claim 7, wherein said first, second, third, fourth, fifth, and sixth transistors has same transistor size.

* * * * *